United States Patent [19]

Horiuchi

[11] Patent Number: 5,043,600
[45] Date of Patent: Aug. 27, 1991

[54] BICMOS INVERTER CIRCUIT

[75] Inventor: Tadahiko Horiuchi, Tokyo, Japan

[73] Assignee: NEC Corporation, Tokyo, Japan

[21] Appl. No.: 433,473

[22] Filed: Nov. 8, 1989

[30] Foreign Application Priority Data

Nov. 8, 1988 [JP] Japan .............................. 63-282710

[51] Int. Cl.$^5$ ...................... H03K 19/02; H03K 17/60
[52] U.S. Cl. .................................... 307/446; 307/542; 307/544; 307/546; 307/563; 307/570
[58] Field of Search ............... 307/443, 446, 451, 542, 307/544, 546, 563, 296.3, 570

[56] References Cited

FOREIGN PATENT DOCUMENTS 0132822 2/1985 European Pat. Off. ............ 307/446

OTHER PUBLICATIONS

*IBM Tech. Disc. Bul.* vol. 29, No. 3, Aug. 1986, "High Impedance Bipolar Inverter Circuit".

*Primary Examiner*—Stanley D. Miller
*Assistant Examiner*—Margaret Rose Wambach
*Attorney, Agent, or Firm*—Helfgott & Karas

[57] ABSTRACT

An inverter circuit is comprised of a bipolar transistor having a base, a collector of one conductivity type held at a first electric potential and an emitter of one conductivity type connected to an output terminal. A first field effect transistor is formed with a channel of opposite conductivity type, and has a gate connected to an input terminal and a pair of source and drain one of which is connected to the base of opposite conductivity of the bipolar transistor and the other of which is held at the first electric potential. A second field effect transistor is formed with a channel of one conductivity type, and has a gate connected to the input terminal and a pair of source and drain one of which is connected to the base of opposite conductivity of the bipolar transistor and the other of which is held at a second electric potential. A didode has an anode connected to the output terminal and a cathode connected to one of the source and drain of said second field effect transistor.

5 Claims, 2 Drawing Sheets

BICMOS INVERTER CIRCUIT

BACKGROUND OF THE INVENTION

The present invention relates to an inverter circuit, and more specifically to a particular inverter circuit of the type comprised of field effect transistors and bipolar transistors featuring high speed operation and low power consumption.

FIG. 1 shows a conventional inverter circuit comprised of MOS transistors and NPN transistors, which have been generally used to provide high speed performance. In FIG. 1, the circuit is comprised of a PMOS transistor 3, N-channel MOS transistors 4, 5, and 6 and NPN transistors 7 and 8. The NPN transistor 7 has a collector C connected to a power source terminal 9, an emitter E connected to an output terminal 2 and a base B connected to a drain D of the PMOS transistor 3. The other NPN transistor 8 has a collector C connected to the output terminal 2 and to a drain D of the NMOS transistor 5, a base B connected to a source S of the N-channel MOS transistor 5, and an emitter E connected to the ground. The N-channel MOS transistor 4 has a drain D connected to the drain D of the P-channel MOS transistor 3 and to the base B of the NPN transistor 7, and a source S connected to the ground. Further, the N-channel MOS transistor 6 has a drain D connected to the source S of the N-channel MOS transistor 5 and to the base B of the NPN transistor 8, and a source S connected to the ground. The N-channel MOS transistor 4 operates when the P-channel MOS transistor 3 turns off and the NMOS transistor 5 turns on to draw electric charge stored in the base of the NPN transistor 7 to thereby switch the NPN transistor 7 to the OFF-state. On the other hand, the N-channel MOS transistor 6 operates when the PMOS transistor 3 turns on and the N-channel MOS transistor 5 turns off to draw electric charge stored in the base of the NPN transistor 8 to thereby switch the NPN transistor 8 to the OFF-state.

The FIG. 1, the inverter circuit has the following drawbacks with respect to the NMOS transistor 4. Firstly, since the gate of the N-channel MOS transistor 4 is connected to an input terminal 1 as well as the P-channel MOS transistor 3 and N-channel MOS transistor 5 those of which drive the NPN transistors 7 and 8, respectively, an input capacitance is unavoidably increased. Next, when the N-channel MOS transistor 4 turns on to draw base charge from the NPN transistor 7, there may be caused possibility that the NPN transistor 7 is transiently and excessively reverse-biased between the base and emitter. If the reverse-biasing exceeds the emitter-base withstanding voltage, hot carriers are generated due to avalanche multiplication. Consequently, electric charge may be stored in the $SiO_2$ region which contacts with a depletion layer between the base and emitter, or interface-state of an interface between Si and $SiO_2$ regions may be increased to thereby lower $h_{FE}$ of the bipolar transistor to cause reliability problem. On the other hand, in order to eliminate the above noted drawbacks, a gate width of the NMOS transistor 4 could be reduced; however, such arrangement would cause another problem. Namely, it takes a longer time to draw the base charge of the NPN transistor 7 thereby impairing the operation speed of the circuit. In addition, the inverter circuit of FIG. 1 is basically composed of six elements, the number of which is greater than that of another type of the conventional inverter of FIG. 2 composed of a CMOS having two elements, thereby causing drawback shaped with that of the circuit of FIG. 1, which is a large area on an integrated circuit device.

SUMMARY OF THE INVENTION

An object of the present invention is to eliminate the above noted drawbacks of the prior art. The inventive inverter circuit is comprised of a bipolar transistor having a collector of one conductivity type held at a first electric potential, a base, and an emitter of said one conductivity type connected to an output terminal, a first field effect transistor of another conductivity type opposite to the one conductivity type and having a gate connected to an input terminal, a drain connected to the base of the opposite conductivity type of the bipolar transistor and a source held at the first electric potential, a second field effect transistor of said one conductivity type having a gate connected to the input terminal, a drain connected to the base of the opposite conductivity type of the bipolar transistor and a source held at a second electric potential, and a diode having an anode connected to the output terminal and a cathode connected to the drain of the second field effect transistor of the one conductivity type.

In a preferred embodiment of the present invention, the diode is comprised of a Schottky diode.

According to the present invention, a single NMOS transistor is provided to carry out functions of the NMOS transistor 4, NMOS transistor 5 and NPN transistor 8 of the FIG. 1 prior art circuit and t avoid reverse-biasing under various circuit operation conditions, which would occur between the emitter and base of the NPN transistor 7 of FIG. 1 circuit.

DETAILED DESCRIPTION OF EMBODIMENTS

Figure 3:
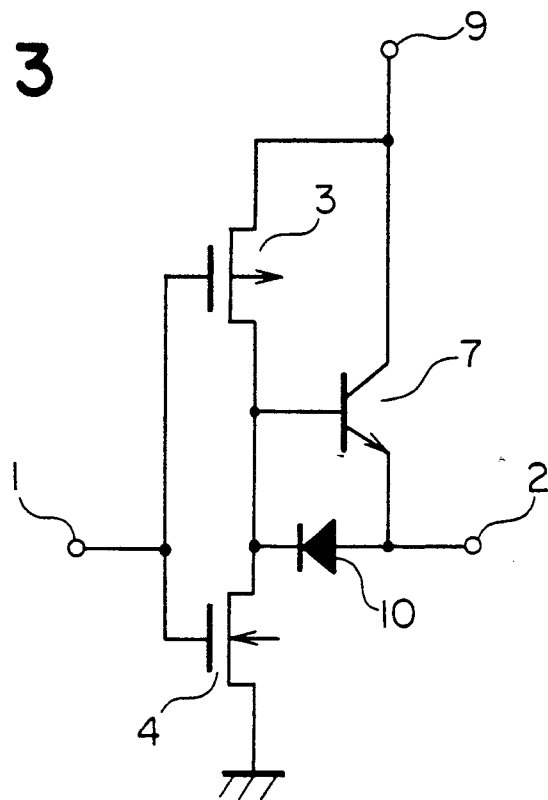
FIG. 3 is an inverter circuit diagram showing one embodiment of the present invention.

Next, the present invention is described with reference to the drawings. FIG. 3 is a circuit diagram showing one embodiment of the present invention. In the figure, the circuit is comprised of an NMOS transistor 4 of one conductivity type field effect transistor, a PMOS transistor 3 of opposite conductivity type field effect transistor, an NPN bipolar transistor 7 and a diode 10. A collector of the NPN transistor 7 and a source of the P-channel MOS transistor 3 are held at a power supply potential $V_{cc}$ 9, a source of the N-channel MOS transistor 4 is held at the ground potential, respective gates of the P-channel MOS transistor 3 and N-channel MOS transistor 4 are connected to an input terminal 1, respective drains of the P-channel MOS transistor 3 and N-channel MOS transistor 4 and a cathode of the diode 10 are altogether connected to a base of the NPN transistor 7, and an emitter of the NPN transistor 7 and an anode of the diode 10 are connected to the output terminal 2.

Operation of the inverter circuit of this embodiment is described in conjunction with FIG. 3. When a potential level of the input terminal 1 is shifted from High level to Low level, at first the P-channel MOS transistor 3 is turned on to raise a base potential level of the NPN transistor 7. On the other hand, since the emitter of the NPN transistor 7 is connected to the output terminal 2, it is held at Low level at the initial state. Consequently the NPN transistor 7 is forwardly biased between its base and emitter. Subsequently, the NPN transistor 7 is turned on to raise a potential level of the output terminal 2 due to an emitter current of the NPN transistor 7 so that the potential level of the output terminal becomes High level. During this sequence, since the N-channel MOS transistor 4 is kept off and the diode 10 is reversely biased, they do not affect the operation of the circuit.

When the potential level of the input terminal 1 is shifted from the Low level to the High level, at this time the N-channel MOS transistor 4 is turned on. At the initial stage of the shift, since the NPN transistor 7 is stored with electric charge at its base, the base of the NPN transistor 7 is held at a potential level higher than that of the emitter. Therefore, the diode 10 is reversely biased so that the NMOS transistor 4 operates firstly to discharge the base charge of the NPN transistor 7. When the base charge is discharged, subsequently the output terminal 2 is driven by the NMOS transistor 4 through the diode 10 to thereby switch from High level to the Low level.

In this embodiment of the invention, the diode 10 is preferrably a Schottky diode. Since the Schottky diode is a majority carrier device, minority carrier is not substantially stored. For this reason, when the diode 10 is biased forwardly or reversely during the above described operation, the P-channel MOS transistor 3 and the N-channel MOS transistor 4 do not need to charge or discharge the minority carrier, thereby achieving high speed operation of the circuit. Further appropriate material can be selected for a metal component of the Schottky diode so as to lower the forward direction voltage relative to the PN junction. For example, Schottky barrier levels of $CoSi_2$ and $TiSi_2$ are, respectively, 0.65 V and 0.6 V. Accordingly, the inventive inverter circuit can set the output potential close to the ground level as compared to the conventional circuit of FIG. 1 in which the output potential never falls below built-in voltage between the emitter and base of the NPN transistor.

Figure 1:
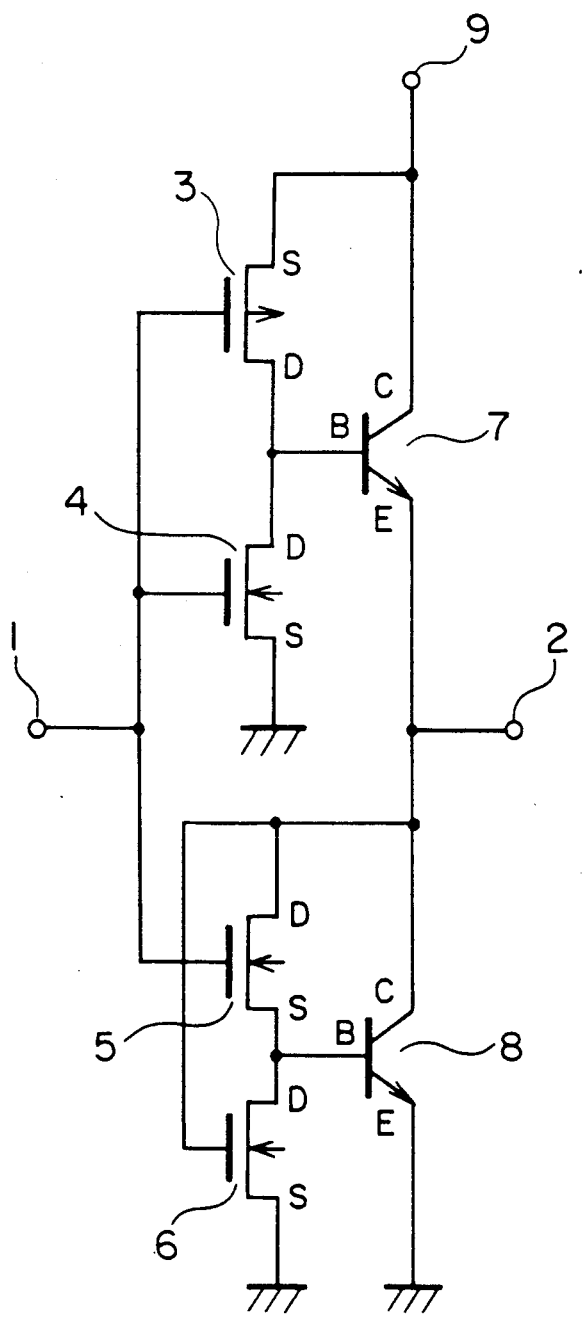
FIG. 1 is an inverter circuit diagram of the prior art.
Figure 2:
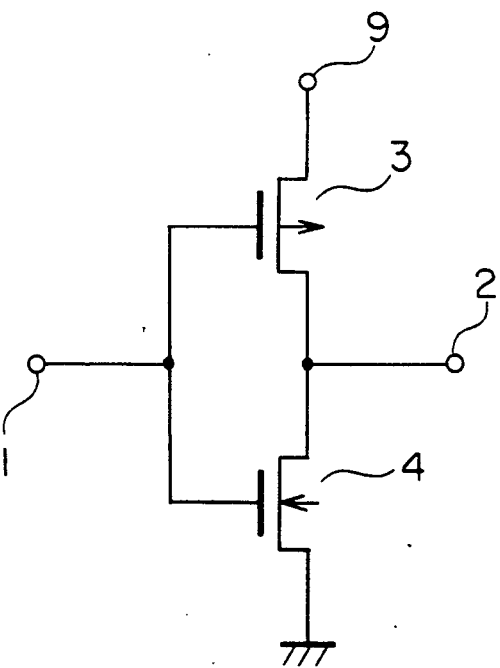
FIG. 2 is an CMOS inverter circuit diagram of the prior art.

In the conventional circuit of FIG. 1, the NPN transistor 7 would likely be reverse-biased between the base and emitter thereof and the degree of the reverse-biasing depends on a size of individual transistors and a load connected to the output terminal 2. On the other hand, in the inverter circuit according to the present invention, the reverse-biasing voltage applied between the base and the emitter of the NPN transistor 7 is equal to a divided voltage of the output potential level divided by the diode 10 and the NMOS transistor 4, i.e., the potential difference generated across the terminals of the diode 10. A parasitic resistance of the diode 10 can be easily controlled below $200\Omega$. Therefore, when the NMOS transistor 4 has a channel resistance of, for example, $600\Omega$, the reverse-biasing voltage between the base and emitter may be at most 1.25 V with respect to 5 V of the power supply voltage. Since a bipolar transistor has an emitter-base withstanding voltage normally above 3 V, relaiability problem is not caused due to the reverse-biasing between the base and the emitter of the transistor according to the present invention.

Figure 4:
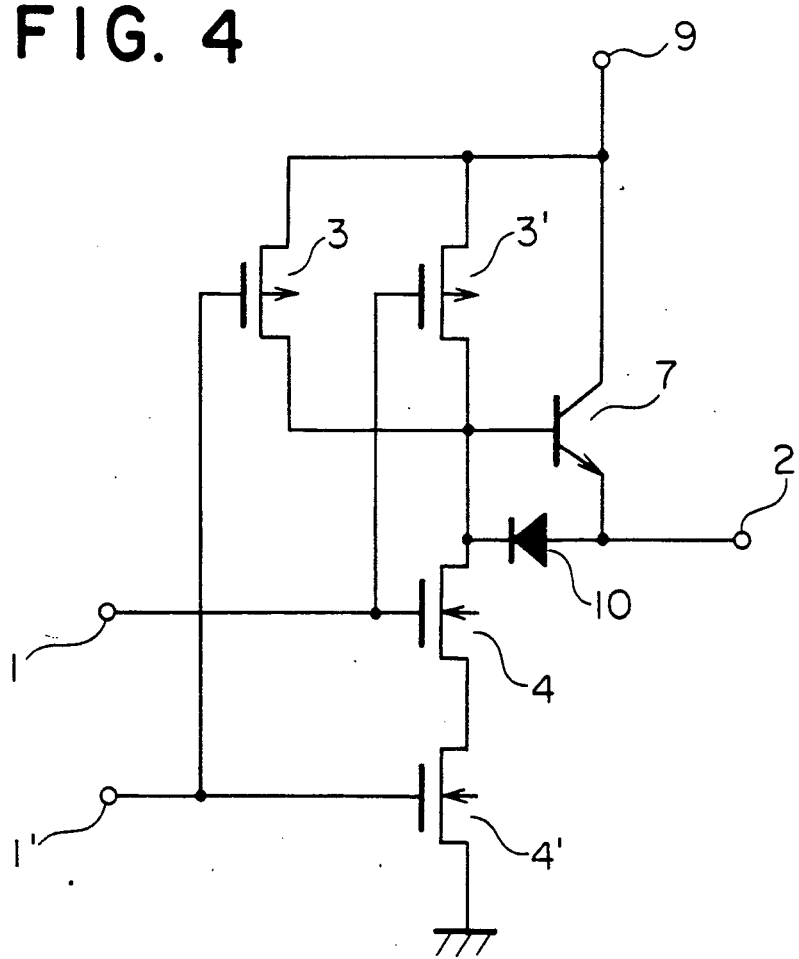
FIG. 4 is an inverter circuit diagram showing another embodiment of the present invention.

FIG. 4 is a circuit diagram of another embodiment according to the present invention, and the FIG. 4 embodiment constitutes a two-input NAND gate circuit which includes a first P-channel MOS transistor 3, a second P-channel MOS transistor 3', a first N-channel MOS transistor 4, a second N-channel MOS transistor 4', and a NPN bipolar transistor 7 and a diode 10. A collector of the NPN transistor 7 and respective sources of the first and second P-channel MOS transistors 3, 3' are connected to a power supply 9. A source of the first N-channel MOS transistor 4 is connected to a drain of the second N-channel MOS transistor 4', and a source of the second N-channel MOS transistor 4' is grounded. Respective gates of the second P-channel MOS transistor 3' and the first N-channel MOS transistor 4 are connected to a first input terminal 1, and respective gates of the first P-channel MOS transistor 3 and the second N-channel MOS transistor 4' are connected to a second input terminal 1. Respective drains of the second P-channel MOS transistor 3' and the first N-channel MOS transistor 4 and a cathode of the diode 10 are altogether connected to the base of the NPN transistor 7. The emitter of the NPN transistor 7 and the anode of the diode 10 are connected to the output terminal 2.

As described above, in the inventive inverter circuit, a single N-channel MOS transistor operates to carry out functions of three elements of the conventional inverter circuit, i.e., the N-channel MOS transistor for drawing the base charge, the bipolar transistor and the other N channel MOS transistor for driving the bipolar transistor. By such construction, a number of elements of the inverter circuit is reduced from six to four, and the input capacity is also reduced. Further, the invention can eliminate reliability problem due to the reverse-biasing between the emitter and the base, which would occur in the conventional inverter circuit.

What is claimed is:

1. An inverter circuit comprising a bipolar transistor having a collector of one conductivity type held at a first electric potential, an emitter of said one conductivity type connected to an output terminal and a base of another conductivity type opposite to said one conductivity type; a first field effect transistor formed with a channel of another conductivity type opposite to said one conductivity type, and having a gate connected to an input terminal and a pair of source and drain terminals, one of which is connected to the base of said bipolar transistor and another of which is held at the first electric potential; a second field effect transistor formed with a channel of one conductivity type, and having a gate connected to the input terminal and a pair of source and drain terminals one of which is connected to the base of said bipolar transistor and another of which is directly connected to and held at a second electric potential; and a diode having an anode connected to the output terminal and a cathode connected to one of the source and drain terminals of said second field effect transistor formed with a channel of one conductivity type, wherein the output terminal is led to a raised potential level by said bipolar transistor and a discharge is performed by a current flowing through said diode and said second field effect transistor.

2. An inverter circuit as claimed in claim 1, wherein said diode comprises a Schottky diode.

3. An inverter circuit as claimed in claim 2, wherein said diode comprises a Schottky diode made from $CoSi_2$ or $TiSi_2$.

4. An inverter circuit comprising a N-channel MOS transistor, a P-channel MOS transistor, a NPN bipolar transistor, and a diode, wherein a collector of the NPN transistor and a source of the P-channel MOS transistor are connected to a power supply, a source of the N- channel MOS transistor is directly connected to the ground, respective gates of the P-channel MOS transistor and the N-channel MOS transistor are connected to an input terminal, respective drains of the P-channel MOS transistor and the N-channel MOS transistor and a cathode of the diode are all connected to a base of the NPN transistor, and an emitter of the NPN transistor and an anode of the diode are connected to an output terminal, and wherein the output terminal is led to a raised potential level by the NPN bipolar transistor and a discharge is performed by a current flowing through the diode and the N-channel MOS transistor.

5. An inverter circuit comprising a first N-channel MOS transistor, a second N-channel MOS transistor, a first P-channel MOS transistor, a second P-channel MOS transistor, a NPN bipolar transistor, and a diode, wherein a collector of the NPN transistor and respective sources of the first and second P-channel MOS transistors are connected to a power supply, a source of the first N-channel MOS transistor is connected to a drain of the second N-channel MOS transistor, a source of the second N-channel MOS transistor is directly connected to the ground, respective gates of the second P-channel MOS transistor and the first N-channel MOS transistor are connected to a first input terminal, respective gates of the first P-channel MOS transistor and the second N-channel MOS transistor are connected to a second input terminal, respective drains of the first P-channel MOS transistor and the first N-channel MOS transistor and a cathode of the diode are all connected to a base of the NPN bipolar transistor and an emitter of the NPN bipolar transistor and an anode of the diode are connected to the output terminal, and wherein the output terminal is led to a raised potential level by the NPN bipolar transistor and a discharge is performed by a current flowing through the diode and the first and second N-channel MOS transistors.

* * * * *